US012598701B2

(12) United States Patent
Chiu

(10) Patent No.: US 12,598,701 B2
(45) Date of Patent: Apr. 7, 2026

(54) SEMICONDUCTOR DEVICE WITH SELECTION STRUCTURE AND METHOD FOR FABRICATING THE SAME

(71) Applicant: NANYA TECHNOLOGY CORPORATION, New Taipei City (TW)

(72) Inventor: Hsih-Yang Chiu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 416 days.

(21) Appl. No.: 18/382,207

(22) Filed: Oct. 20, 2023

(65) Prior Publication Data

US 2024/0422906 A1    Dec. 19, 2024

Related U.S. Application Data

(62) Division of application No. 18/209,755, filed on Jun. 14, 2023, now Pat. No. 12,453,008.

(51) Int. Cl.
H05K 1/11 (2006.01)
H01L 23/498 (2006.01)

(52) U.S. Cl.
CPC ........ H05K 1/112 (2013.01); H01L 23/49822 (2013.01)

(58) Field of Classification Search
CPC .......................... H01L 23/49822; H10B 63/30
See application file for complete search history.

(56) References Cited

U.S. PATENT DOCUMENTS

| | | | | |
|---|---|---|---|---|
| 7,285,477 | B1 * | 10/2007 | Bernstein | .......... H01L 21/76898 257/532 |
| 9,646,930 | B2 * | 5/2017 | Tezcan | .............. H01L 21/76898 |
| 10,157,867 | B1 * | 12/2018 | Chen | ..................... H01L 23/522 |
| 2006/0120148 | A1 * | 6/2006 | Kim | ........................ H10B 63/30 365/163 |
| 2007/0063180 | A1 * | 3/2007 | Asano | ................ H10N 70/8825 257/3 |

(Continued)

FOREIGN PATENT DOCUMENTS

TW        202240829 A    10/2022

OTHER PUBLICATIONS

Office Action and Search Report dated on Mar. 8, 2024 related to Taiwanese Application No. 112129901.

*Primary Examiner* — Evren Seven
(74) *Attorney, Agent, or Firm* — Xuan Zhang

(57) ABSTRACT
A semiconductor device includes a first top selection structure and a second top selection structure at a same vertical level as and separated from a main signal pad, and respectively extending along different directions; a first ground layer at the same vertical level as and separated from the main signal pad and the top selection structures; a first bottom selection structure at a vertical level lower than the main signal pad and partially overlapped with the top selection structures and the first ground layer in a top-view perspective; a first top via between the first ground layer and the first bottom selection structure; second top vias between the top selection structures and the first bottom selection structure; first insulating layers between the second top vias and the first bottom selection structure; and a wiring pad on the main signal pad and the top selection structures.

14 Claims, 30 Drawing Sheets

(56)                    References Cited

U.S. PATENT DOCUMENTS

| | | | |
|---|---|---|---|
| 2007/0155150 A1* | 7/2007 | Kim | H01L 21/76834 |
| | | | 257/E21.507 |
| 2007/0190692 A1* | 8/2007 | Erturk | H01L 21/76898 |
| | | | 257/E21.597 |
| 2007/0268742 A1* | 11/2007 | Liu | G11C 11/161 |
| | | | 365/163 |
| 2008/0007995 A1* | 1/2008 | Schwerin | H10B 63/30 |
| | | | 365/158 |
| 2009/0085121 A1* | 4/2009 | Park | H10B 63/30 |
| | | | 257/E21.409 |
| 2009/0230391 A1* | 9/2009 | Noshiro | H10N 70/028 |
| | | | 257/E21.409 |
| 2010/0296338 A1* | 11/2010 | Park | H10B 63/30 |
| | | | 365/163 |
| 2022/0310545 A1* | 9/2022 | Shih | H01L 24/24 |
| 2022/0328401 A1* | 10/2022 | Huang | H01L 23/5226 |
| 2024/0047287 A1* | 2/2024 | Huang | H01L 23/18 |

* cited by examiner

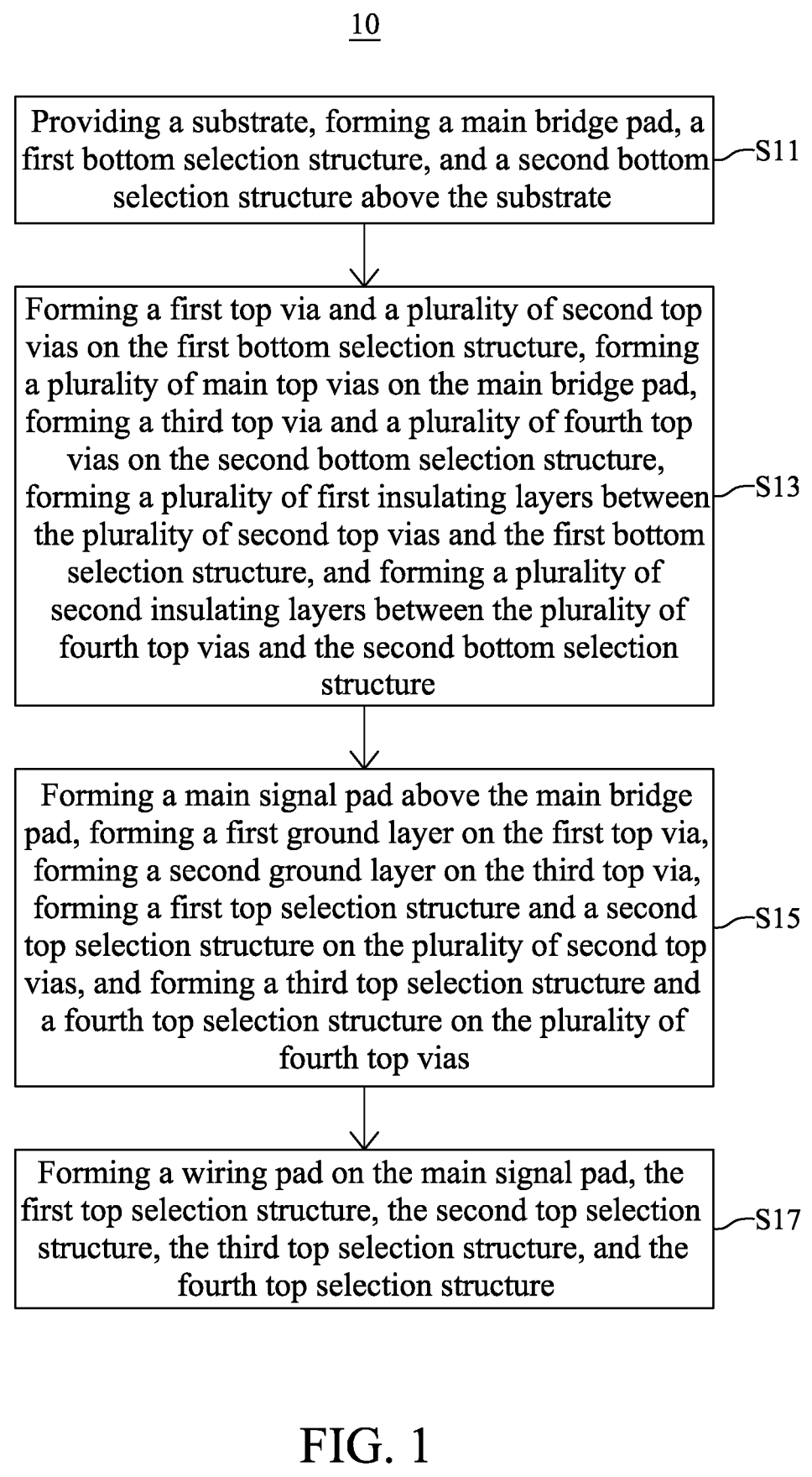

10

| Providing a substrate, forming a main bridge pad, a first bottom selection structure, and a second bottom selection structure above the substrate | ⟋–S11 |

↓

| Forming a first top via and a plurality of second top vias on the first bottom selection structure, forming a plurality of main top vias on the main bridge pad, forming a third top via and a plurality of fourth top vias on the second bottom selection structure, forming a plurality of first insulating layers between the plurality of second top vias and the first bottom selection structure, and forming a plurality of second insulating layers between the plurality of fourth top vias and the second bottom selection structure | ⟋–S13 |

↓

| Forming a main signal pad above the main bridge pad, forming a first ground layer on the first top via, forming a second ground layer on the third top via, forming a first top selection structure and a second top selection structure on the plurality of second top vias, and forming a third top selection structure and a fourth top selection structure on the plurality of fourth top vias | ⟋–S15 |

↓

| Forming a wiring pad on the main signal pad, the first top selection structure, the second top selection structure, the third top selection structure, and the fourth top selection structure | ⟋–S17 |

FIG. 1

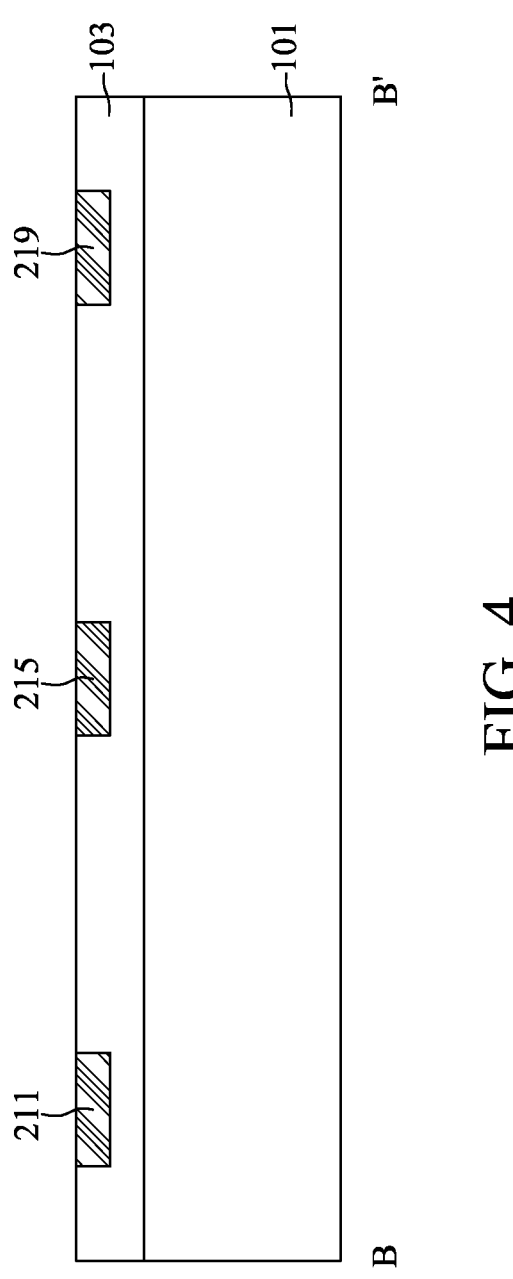
FIG. 4

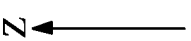
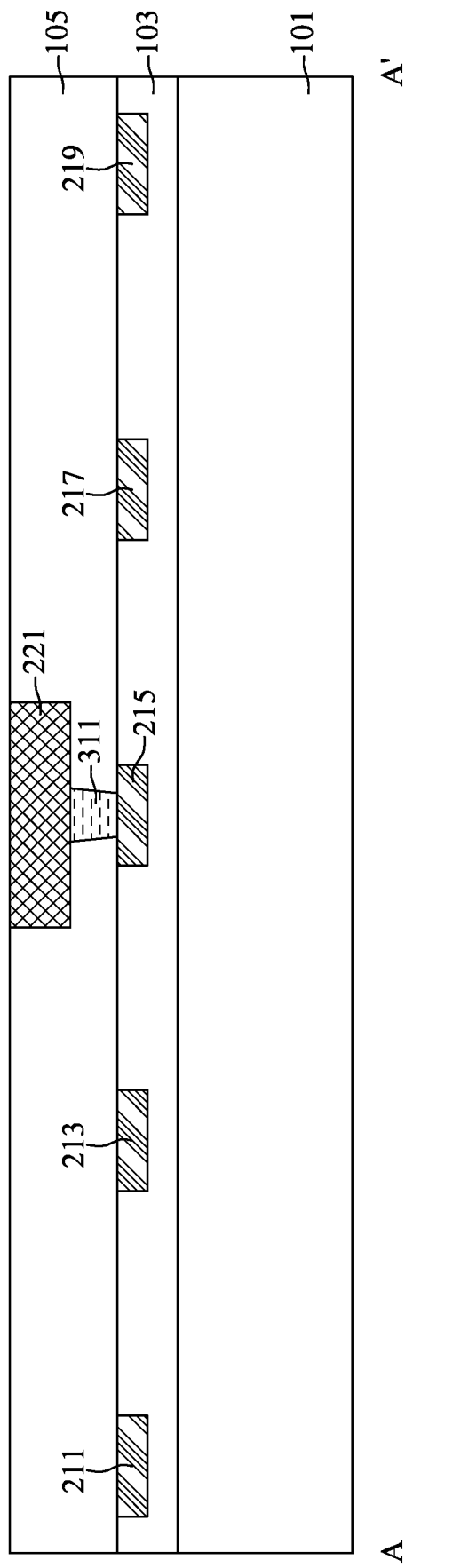
FIG. 6

SEMICONDUCTOR DEVICE WITH SELECTION STRUCTURE AND METHOD FOR FABRICATING THE SAME

CROSS-REFERENCE TO RELATED APPLICATION

This application is a divisional application of U.S. Non-Provisional application Ser. No. 18/209,755 filed Jun. 14, 2023, which is incorporated herein by reference in its entirety.

TECHNICAL FIELD

The present disclosure relates to a semiconductor device and a method for fabricating the semiconductor device, and more particularly, to a semiconductor device with selection structures and a method for fabricating the semiconductor device with the selection structures.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first top selection structure positioned at a same vertical level as a main signal pad, along a first direction, and separated from the main signal pad; a second top selection structure positioned at the same vertical level as the main signal pad, along a second direction different from the first direction, and separated from the main signal pad; a first ground layer positioned at the same vertical level as the main signal pad and separated from the main signal pad, the first top selection structure, and the second top selection structure; a first bottom selection structure positioned at a vertical level lower than the main signal pad and partially overlapped with the first top selection structure, the second top selection structure, and the first ground layer in a top-view perspective; a first top via positioned between the first ground layer and the first bottom selection structure; a plurality of second top vias positioned between the first top selection structure and the first bottom selection structure, and between the second top selection structure and the first bottom selection structure; a plurality of first insulating layers positioned between the plurality of second top vias and the first bottom selection structure; and a wiring pad positioned on the main signal pad, the first top selection structure, and the second top selection structure.

Another aspect of the present disclosure provides a semiconductor device including a first top selection structure positioned at a same vertical level as a main signal pad, along a first direction, and separated from the main signal pad; a fourth top selection structure positioned at the same vertical level as the main signal pad and separated from the first top selection structure along the first direction with the main signal pad interposed therebetween; a first ground layer positioned at the same vertical level as the main signal pad and separated from the main signal pad and the first top selection structure; a second ground layer positioned at the same vertical level as the main signal pad and separated from the fourth top selection structure and the main signal pad; a first bottom selection structure positioned at a vertical level lower than the main signal pad and partially overlapped with the first top selection structure and the first ground layer in a top-view perspective; a second bottom selection structure positioned at the same vertical level as the first bottom selection structure and partially overlapped with the fourth top selection structure and the second ground layer in a top-view perspective; a first top via positioned between the first ground layer and the first bottom selection structure; a third top via positioned between the second ground layer and the second bottom selection structure; a second top via positioned between the first top selection structure and the first bottom selection structure; a fourth top via positioned between the fourth top selection structure and the second bottom selection structure; and a first insulating layer positioned between the second top via and the first bottom selection structure; a second insulating layer positioned between the fourth top via and the second bottom selection structure.

Another aspect of the present disclosure provides a method for fabricating a semiconductor device including forming a first bottom selection structure over a substrate and including a first connecting bottom selection layer, a first vertical bottom selection layer extending from the first connecting bottom selection layer along a first direction, and a first horizontal bottom selection layer extending from the first connecting bottom selection layer along a second direction different from the first direction; forming a plurality of second top vias on the first horizontal bottom selection layer and the first vertical bottom selection layer and forming a first top via on the first connecting bottom selection layer; forming a plurality of first insulating layers between the plurality of second top vias and the first horizontal bottom selection layer and between the plurality of second top vias and the first vertical bottom selection layer; forming a first ground layer on the first top via; forming a first top selection structure and a second top selection structure on the plurality of second top vias, respectively and correspondingly; forming a main signal pad at a same vertical level as the first ground layer and separated from the first top selection structure and the second top selection structure; and forming a wiring pad on the main signal pad, the first top selection structure, and the second top selection structure. The first top selection structure is partially overlapped with the first horizontal bottom selection layer and the second top selection structure is partially overlapped with the first vertical bottom selection layer in a top-view perspective.

Due to the design of the semiconductor device of the present disclosure, one or multiple signal paths may be formed depending on the selection during the programming procedure which can be determined by the user's demand. Multiple signals may be conducted solely using the wiring pad to transmit to the main signal pad and the signal path(s) formed through selectively programming of the first top selection structure, the second top selection structure, the third top selection structure, and/or the fourth top selection structure so as to save precious semiconductor real estate. Therefore, more functional elements may be provided for the semiconductor device 1A. As a result, the performance of the semiconductor device 1A may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 illustrates, in a flowchart diagram form, a method for fabricating a semiconductor device in accordance with one embodiment of the present disclosure;

FIGS. 3 and 4 are schematic cross-sectional view diagrams taken along lines A-A' and B-B' in FIG. 2;

FIGS. 6 and 7 are schematic cross-sectional view diagrams taken along lines A-A' and B-B' in FIG. 5;

FIGS. 22 and 23 are schematic cross-sectional view diagrams taken along lines A-A' and B-B' in FIG. 17 illustrating part of the flow for fabricating the semiconductor device in accordance with one embodiment of the present disclosure;

DETAILED DESCRIPTION

Figure 2:
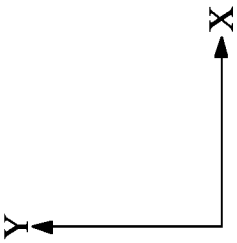
FIG. 2 illustrates, in a schematic top-view diagram, an intermediate semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 3:
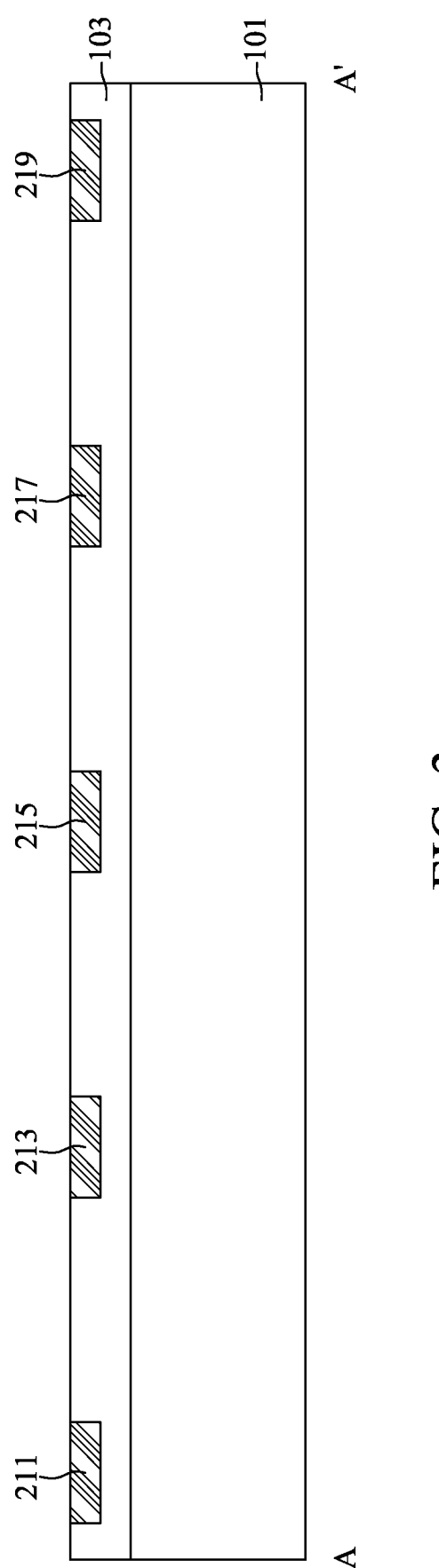
Figure 5:
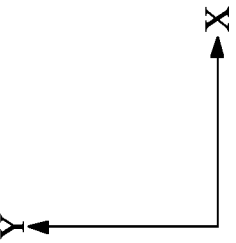
FIG. 5 illustrates, in a schematic top-view diagram, an intermediate semiconductor device in accordance with one embodiment of the present disclosure.
Figure 7:
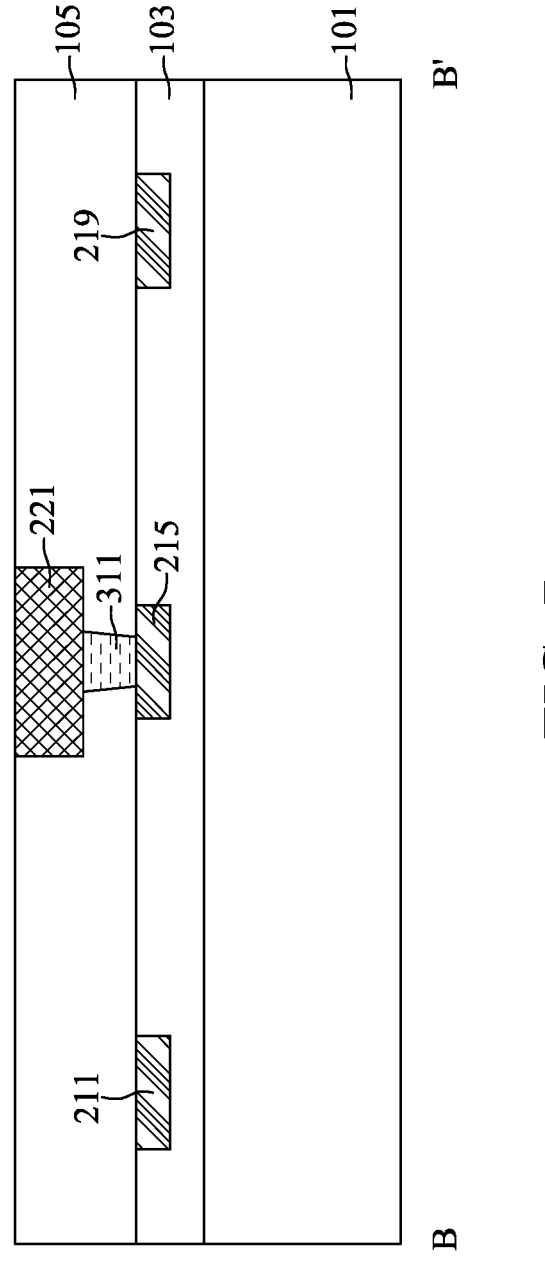

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIGS. 3 and 4 are schematic cross-sectional view diagrams taken along lines A-A' and B-B' in FIG. 2. FIG. 5 illustrates, in a schematic top-view diagram, an intermediate semiconductor device in accordance with one embodiment of the present disclosure. FIGS. 6 and 7 are schematic cross-sectional view diagrams taken along lines A-A' and B-B' in FIG. 5.

Figure 8:
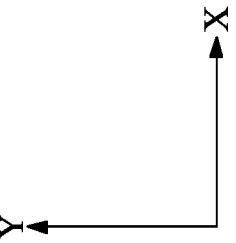
FIG. 8 illustrates, in a schematic top-view diagram, an intermediate semiconductor device in accordance with one embodiment of the present disclosure.
Figure 9:
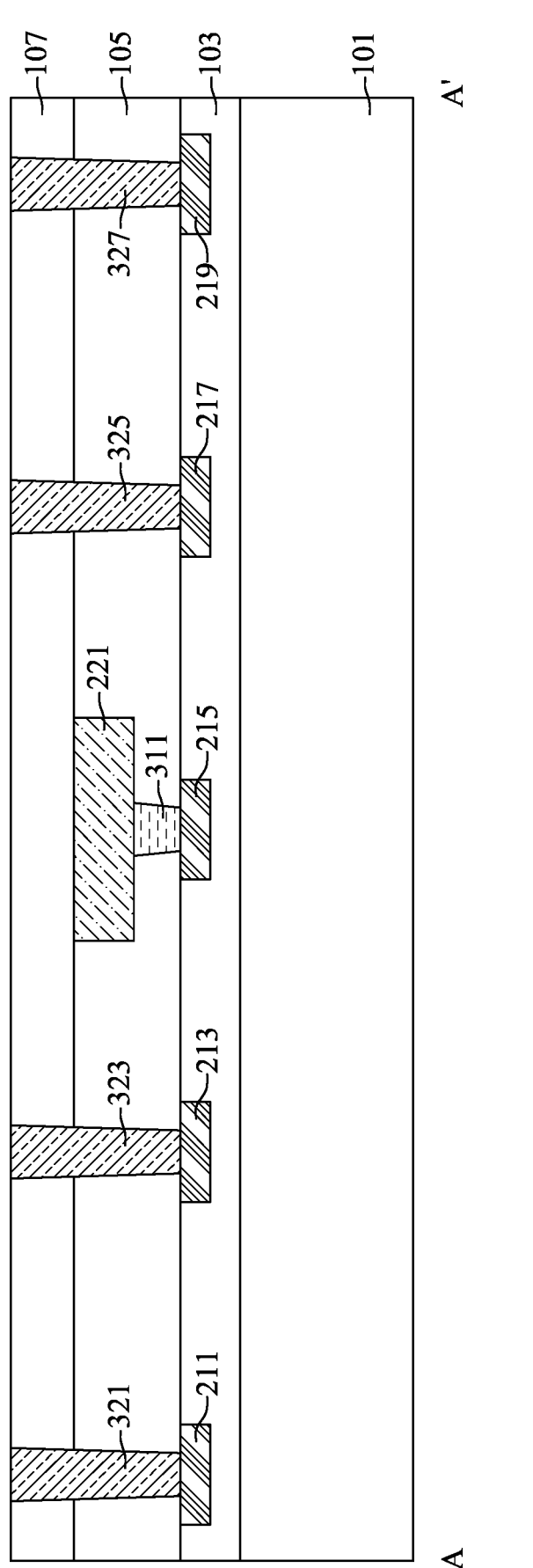
FIGS. 9 and 10 are schematic cross-sectional view diagrams taken along lines A-A' and B-B' in FIG. 8.
Figure 10:
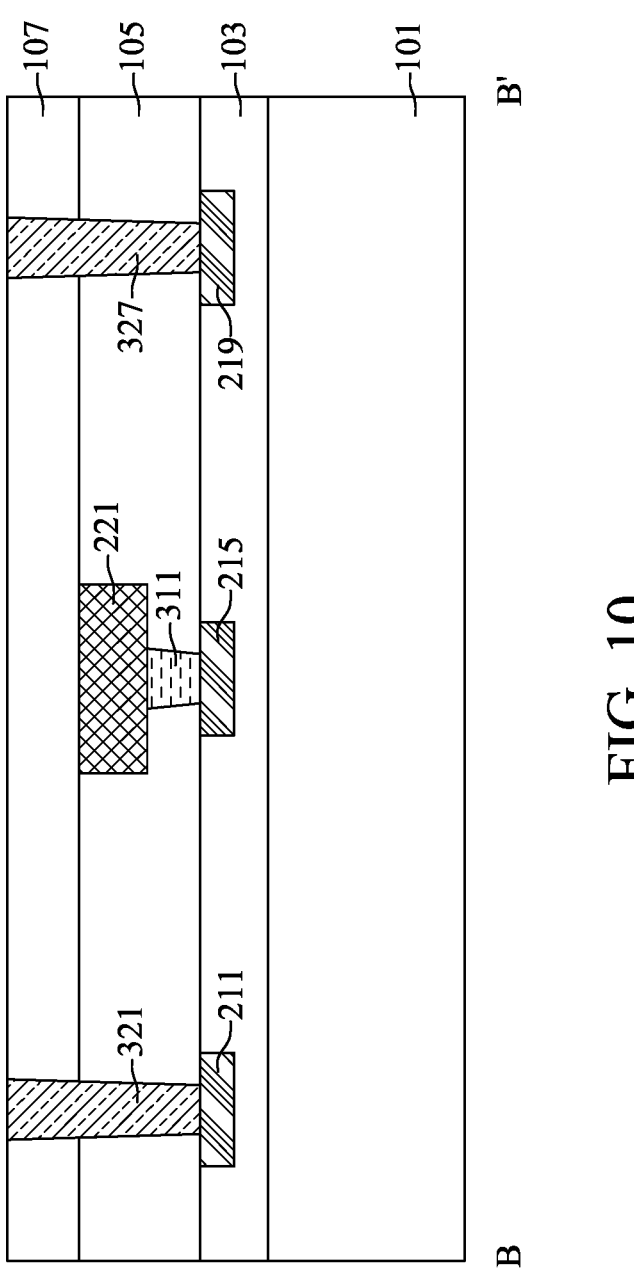
Figure 11:
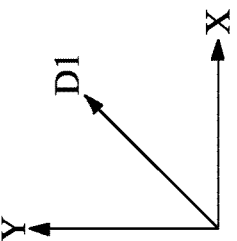
FIG. 11 illustrates, in a schematic top-view diagram, an intermediate semiconductor device in accordance with one embodiment of the present disclosure.
Figure 12:
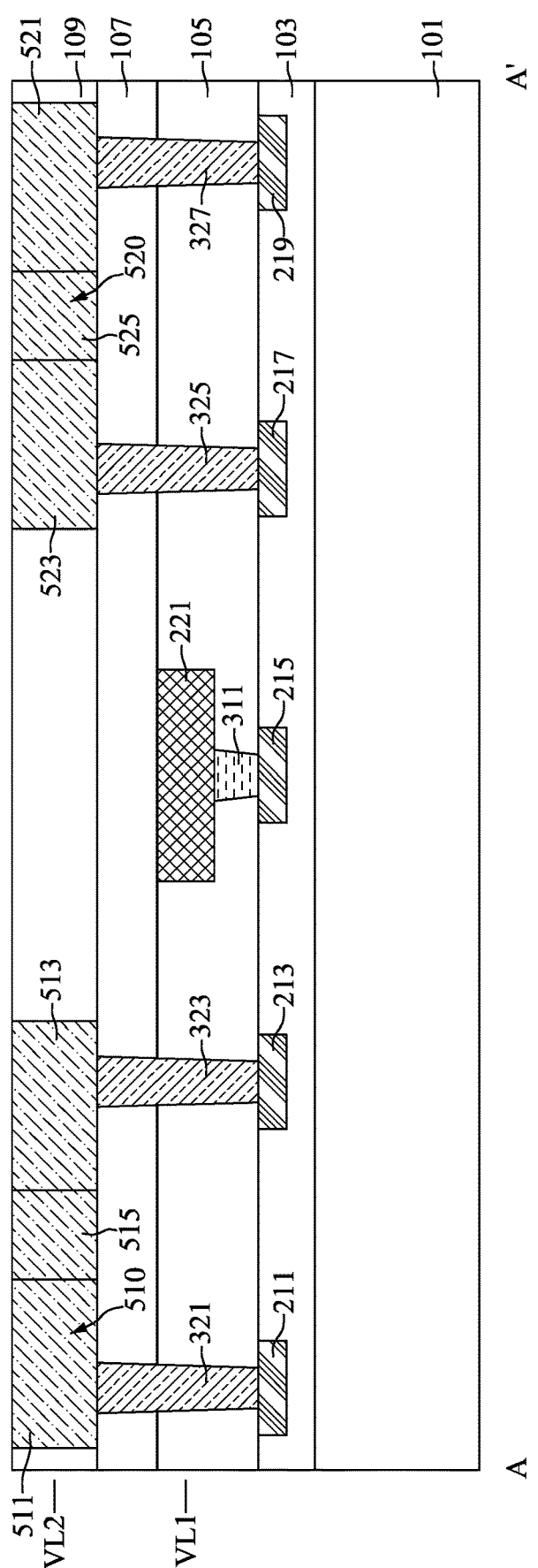
FIGS. 12 and 13 are schematic cross-sectional view diagrams taken along lines A-A' and B-B' in FIG. 11.
Figure 13:
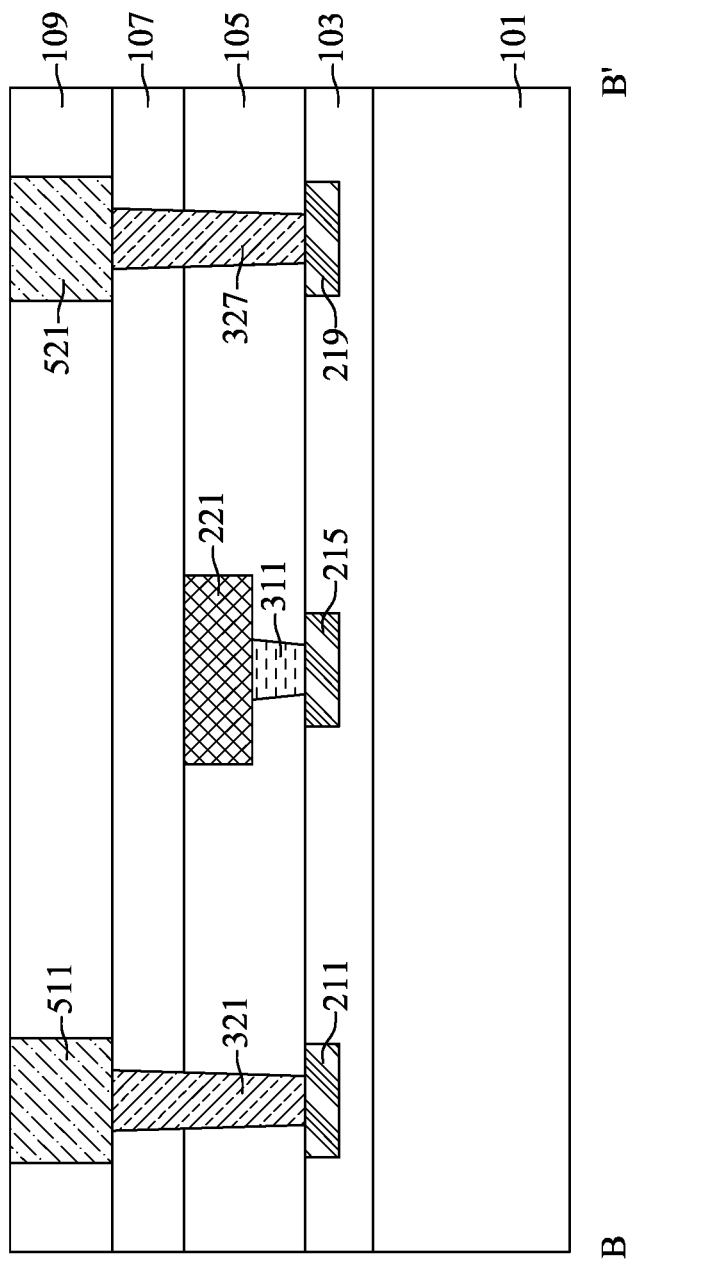

FIG. 8 illustrates, in a schematic top-view diagram, an intermediate semiconductor device in accordance with one embodiment of the present disclosure. FIGS. 9 and 10 are schematic cross-sectional view diagrams taken along lines A-A' and B-B' in FIG. 8. FIG. 11 illustrates, in a schematic top-view diagram, an intermediate semiconductor device in accordance with one embodiment of the present disclosure. FIGS. 12 and 13 are schematic cross-sectional view diagrams taken along lines A-A' and B-B' in FIG. 11.

With reference to FIGS. 1 to 13, at step S11, a substrate 101 may be provided, a main bridge pad 221, a first bottom selection structure 510, and a second bottom selection structure 520 may be formed above the substrate 101.

With reference to FIGS. 2 to 4, in some embodiments, the substrate 101 may include a bulk semiconductor substrate that is composed entirely of at least one semiconductor material, a plurality of device elements (not shown for clarity), a plurality of dielectric layers (not shown for clarity), and a plurality of conductive features (not shown for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof. In some embodiments, the substrate 101 may further include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The plurality of device elements may be formed on the substrate 101. Some portions of the plurality of device elements may be formed in the substrate 101. The plurality of device elements may be transistors such as complementary metal-oxide-semiconductor transistors, metal-oxide-semiconductor field-effect transistors, fin field-effect-transistors, the like, or a combination thereof.

The plurality of dielectric layers may be formed on the substrate 101 and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

The plurality of conductive features may include interconnect layers, conductive vias, and conductive pads. The interconnect layers may be separated from each other and may be horizontally disposed in the plurality of dielectric layers along the direction Z. In the present embodiment, the topmost interconnect layers may be designated as the conductive pads. The conductive vias may connect adjacent interconnect layers along the direction Z, adjacent device element and interconnect layer, and adjacent conductive pad and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive features may together configure functional units of the substrate 101. A functional unit, in the description of the present disclosure, generally refers to functionally related circuitry that has been partitioned for functional purposes into a distinct unit. In some embodiments, the functional units of the substrate 101 may include, for example, highly complex circuits such as processor cores, memory controllers, or accelerator units.

With reference to FIGS. 2 to 4, the first dielectric layer 103 may be formed on the substrate 101. In some embodiments, the first dielectric layer 103 may be part of the plurality of dielectric layers of the substrate 101. In some embodiments, the first dielectric layer 103 may be formed of, for example, silicon oxide, borophosphosilicate glass, undoped silicate glass, fluorinated silicate glass, low-k dielectric materials such as a spin-on low-k dielectric layer or a chemical vapor deposition low-k dielectric layer, or a combination thereof. In some embodiments, the first dielectric layer 103 may include a self-planarizing material such as a spin-on glass or a spin-on low-k dielectric material such as SiLK™. The use of a self-planarizing dielectric material may avoid the need to perform a subsequent planarizing step. In some embodiments, the first dielectric layer 103 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

With reference to FIGS. 2 to 4, a plurality of bottom pads 211, 213, 215, 217, 219 may be formed in the first dielectric layer 103. The top surface of the plurality of bottom pads 211, 213, 215, 217, 219 may be substantially coplanar with the top surface of the first dielectric layer 103. The plurality of bottom pads 211, 213, 215, 217, 219 may be electrically coupled to the device elements of the substrate 101 and may be referred to as part of the conductive features of the substrate 101.

In some embodiments, pad openings (not shown in FIGS. 2 to 4) may be formed in the first dielectric layer 103 and a conductive material may be formed to fill the pad openings to form the plurality of bottom pads 211, 213, 215, 217, 219. A planarization process, such as chemical mechanical polishing, may be performed after the filling of the conductive material to remove excess material and provide a substantially flat surface for subsequent processing steps.

The pad openings may be formed by a photolithography process and a subsequent etching process. In some embodiments, the etching process may be an anisotropic dry etching process using argon and tetrafluoromethane as etchants. The process temperature of the etching process may be between about 120° C. and about 160° C. The process pressure of the etching process is between about 0.3 Torr and about 0.4 Torr. The process duration of the etching process may be between about 33 seconds and about 39 seconds.

Alternatively, in some embodiments, the etching process may be an anisotropic dry etching process using helium and nitrogen trifluoride as etchants. The process temperature of the etching process may be between about 80° C. and about 100° C. The process pressure of the etching process is between about 1.2 Torr and about 1.3 Torr. The process duration of the etching process may be between about 20 seconds and about 30 seconds.

In some embodiments, the conductive material may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

In some embodiments, the pad openings may be sequentially filled with the conductive material by sputtering or electroless plating. For example, when the pad opening are filled by sputtering using an aluminum-copper material as source, the process temperature of sputtering may be between about 100° C. and about 400° C. The process pressure of sputtering may be between about 1 mTorr and about 100 mTorr. For another example, the pad openings may be filled by an electroplating process using a plating solution. The plating solution may comprise copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C.

In some embodiments, the plurality of bottom pads 211, 213, 215, 217, 219 may be arranged in a certain pattern in a top-view perspective. For example, in the present embodiment, the plurality of bottom pads 211, 213, 215, 217, 219 may be arranged in a cross-like pattern. Detailedly, the bottom pad 211 and the bottom pad 219 may be separated from each other along the direction Y and with the bottom pad 215 interposed therebetween. The bottom pad 213 and the bottom pad 217 may be separated from each other along the direction X and with the bottom pad 215 interposed therebetween.

With reference to FIGS. 5 to 7, a second dielectric layer 105 may be formed on the first dielectric layer 103. In some embodiments, the second dielectric layer 105 may be referred to as part of the dielectric layers of the substrate 101. In some embodiments, the second dielectric layer 105 may be formed of a same material as the first dielectric layer 103 and may be formed of a similar procedure as the first dielectric layer 103, and descriptions thereof are not repeated herein.

With reference to FIGS. 5 to 7, a first bottom via 311 may be formed in the second dielectric layer 105 and formed on the bottom pad 215. The main bridge pad 221 may be formed in the second dielectric layer 105 and formed on the first bottom via 311. In some embodiments, the first bottom via 311 and the main bridge pad 221 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the first bottom via 311 and the main bridge pad 221 may be formed by, for example, a damascene process.

With reference to FIGS. 8 to 10, a third dielectric layer 107 may be formed on the second dielectric layer 105. In some embodiments, the third dielectric layer 107 may be referred to as part of the dielectric layers of the substrate 101. In some embodiments, the third dielectric layer 107 may be formed of a same material as the first dielectric layer 103 and may be formed of a similar procedure as the first dielectric layer 103, and descriptions thereof are not repeated herein.

With reference to FIGS. 8 to 10, a plurality of second bottom vias 321, 323, 325, 327 may be formed along the third dielectric layer 107 and the second dielectric layer 105. The plurality of second bottom vias 321, 323, 325, 327 may be formed on the plurality of bottom pads 211, 213, 217, 219, respectively and correspondingly. In some embodiments, the plurality of second bottom vias 321, 323, 325, 327 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the plurality of second bottom vias 321, 323, 325, 327 may be referred to as part of the conductive features of the substrate 101.

With reference to FIGS. 11 to 13, a fourth dielectric layer 109 may be formed on the third dielectric layer 107. In some embodiments, the fourth dielectric layer 109 may be referred to as part of the dielectrics layer of the substrate 101. In some embodiments, the fourth dielectric layer 109 may be formed of a same material as the first dielectric layer 103 and may be formed of a similar procedure as the first dielectric layer 103, and descriptions thereof are not repeated herein.

With reference to FIGS. 11 to 13, the first bottom selection structure 510 may be formed along the fourth dielectric layer 109 and formed on the second bottom via 321 and the second bottom via 323. The second bottom selection structure 520 may be formed along the fourth dielectric layer 109 and formed on the second bottom via 325 and the second bottom via 327. The first bottom selection structure 510 and the second bottom selection structure 520 may be formed at a vertical level VL2 higher than a vertical level VL1 of the main bridge pad 221.

In some embodiments, structure openings (not shown in FIGS. 11 to 13) may be formed in the fourth dielectric layer 109 and a conductive material may be formed to fill the structure openings to form the first bottom selection structure 510 and the second bottom selection structure 520. The structure openings may be formed by a photolithography process and a subsequent etching process. In some embodiments, the etching process may be an anisotropic dry etching process using argon and tetrafluoromethane as etchants. The process temperature of the etching process may be between about 120° C. and about 160° C. The process pressure of the etching process is between about 0.3 Torr and about 0.4 Torr. The process duration of the etching process may be between about 33 seconds and about 39 seconds.

Alternatively, in some embodiments, the etching process may be an anisotropic dry etching process using helium and nitrogen trifluoride as etchants. The process temperature of the etching process may be between about 80° C. and about 100° C. The process pressure of the etching process is between about 1.2 Torr and about 1.3 Torr. The process duration of the etching process may be between about 20 seconds and about 30 seconds. In some embodiments, the conductive material may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

In some embodiments, the structure openings may be sequentially filled with the conductive material by sputtering or electroless plating. For example, when the structure opening are filled by sputtering using an aluminum-copper material as source, the process temperature of sputtering may be between about 100° C. and about 400° C. The process pressure of sputtering may be between about 1 mTorr and about 100 mTorr. For another example, the structure openings may be filled by an electroplating process using a plating solution. The plating solution may comprise copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C.

A planarization process, such as chemical mechanical polishing, may be performed after the filling of the conductive material to remove excess material and provide a substantially flat surface for subsequent processing steps.

With reference to FIGS. 11 to 13, the first bottom selection structure 510 may include a first horizontal bottom selection layer 511, a first vertical bottom selection layer 513, and a first connecting bottom selection layer 515. In a top-view perspective, the first horizontal bottom selection layer 511 may extend along the direction X. The first vertical bottom selection layer 513 may extend along the direction Y. The first horizontal bottom selection layer 511 and the first vertical bottom selection layer 513 may intersect with each other. The intersection portion of the first horizontal bottom selection layer 511 and the first vertical bottom selection layer 513 may be referred to as the first connecting bottom selection layer 515. State differently, the first horizontal bottom selection layer 511 and the first vertical bottom selection layer 513 may respectively extend from the first connecting bottom selection layer 515 along the direction X and the direction Y.

In a cross-sectional perspective, the first horizontal bottom selection layer 511 may be formed on the second bottom via 321. The first vertical bottom selection layer 513 may be formed on the second bottom via 323.

In some embodiments, the first horizontal bottom selection layer 511 and the first vertical bottom selection layer 513 may not extend along directions perpendicular to each other.

With reference to FIGS. 11 to 13, the second bottom selection structure 520 may be separated from the first bottom selection structure 510 along the direction D1 in a top-view perspective. The direction D1 may be slanted with respect to the direction X and the direction Y. The second bottom selection structure 520 may include a second horizontal bottom selection layer 521, a second vertical bottom selection layer 523, and a second connecting bottom selection layer 525.

In a top-view perspective, the second horizontal bottom selection layer 521 may extend along the direction X. In some embodiments, the second horizontal bottom selection layer 521 and the first horizontal bottom selection layer 511 may extend along opposite directions. For example, the first horizontal bottom selection layer 511 may extend along the positive X direction and the second horizontal bottom selection layer 521 may extend along the negative X direction. The second vertical bottom selection layer 523 may extend along the direction Y. In some embodiments, the second vertical bottom selection layer 523 and the first vertical bottom selection layer 513 extend along opposite directions. For example, the first vertical bottom selection layer 513 may extend along the positive Y direction and the second vertical bottom selection layer 523 may extend along the negative Y direction.

The second horizontal bottom selection layer 521 and the second vertical bottom selection layer 523 may intersect with each other in a top-view perspective. The intersection portion of the second horizontal bottom selection layer 521 and the second vertical bottom selection layer 523 may be referred to as the second connecting bottom selection layer 525. State differently, the second horizontal bottom selection layer 521 and the second vertical bottom selection layer 523 may respectively extend from the second connecting bottom selection layer 525 along the direction X and the direction Y.

In a cross-sectional perspective, the second horizontal bottom selection layer 521 may be formed on the second bottom via 327. The second vertical bottom selection layer 523 may be formed on the second bottom via 325.

In some embodiments, the second horizontal bottom selection layer 521 and the second vertical bottom selection layer 523 may not extend along directions perpendicular to each other. In such a situation, the second horizontal bottom selection layer 521 may still extend along a direction parallel to the first horizontal bottom selection layer 511 and the second vertical bottom selection layer 523 may still extend along a direction parallel to the first vertical bottom selection layer 513.

Figure 14:
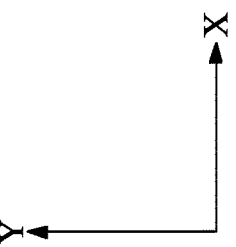
FIG. 14 illustrates, in a schematic top-view diagram, an intermediate semiconductor device in accordance with one embodiment of the present disclosure.
Figure 15:
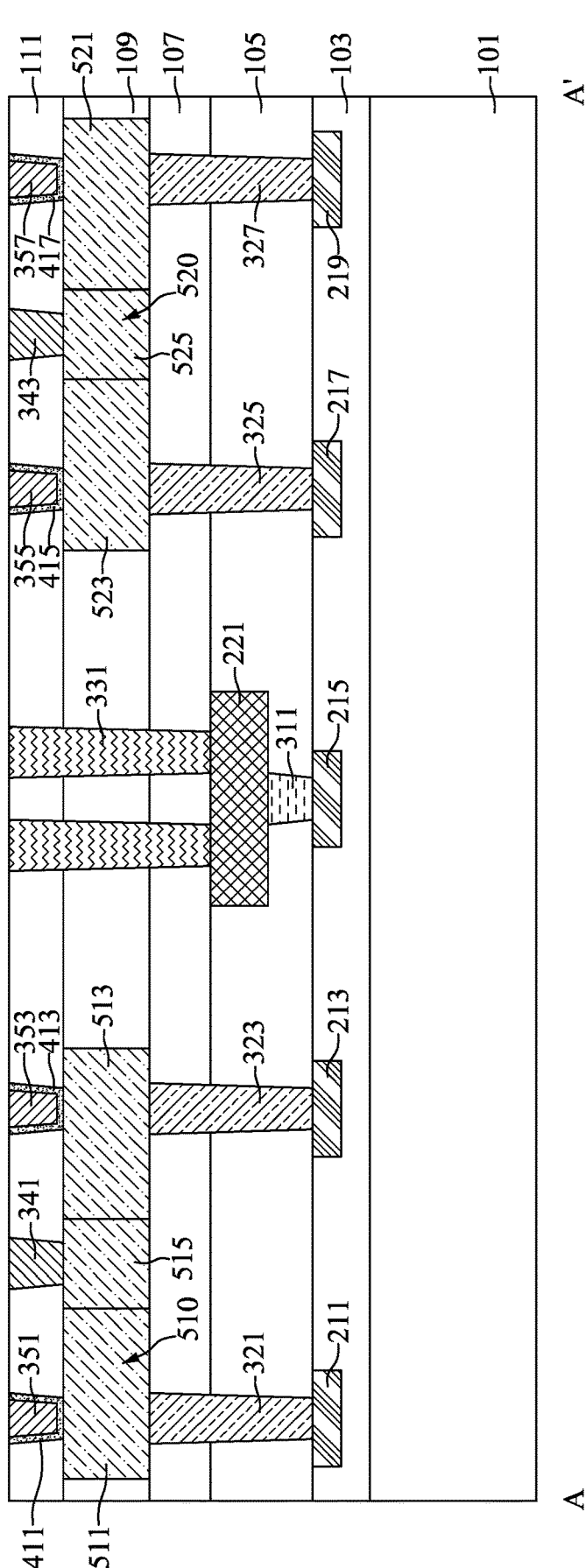
FIGS. 15 and 16 are schematic cross-sectional view diagrams taken along lines A-A' and B-B' in FIG. 14.
Figure 16:
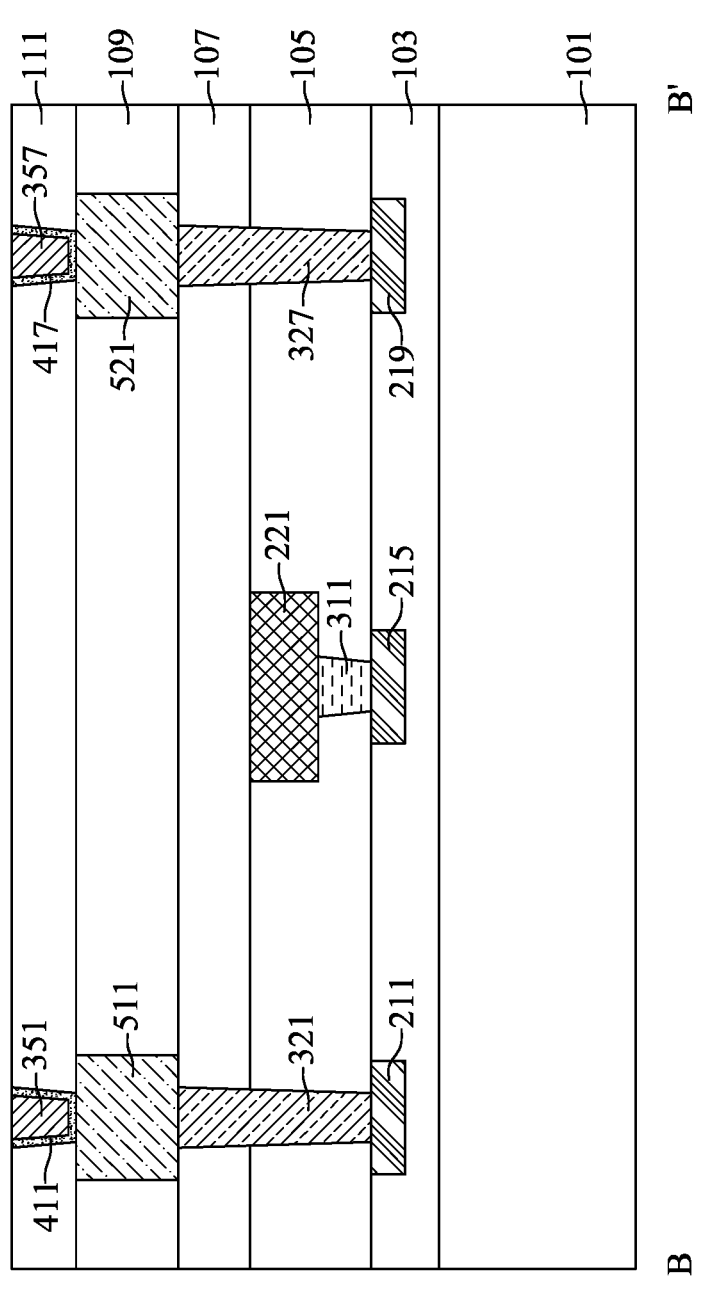
Figure 17:
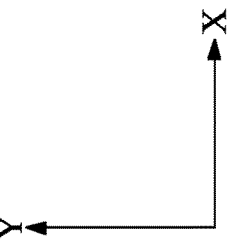
FIG. 17 illustrates, in a schematic top-view diagram, an intermediate semiconductor device in accordance with one embodiment of the present disclosure.
Figure 18:
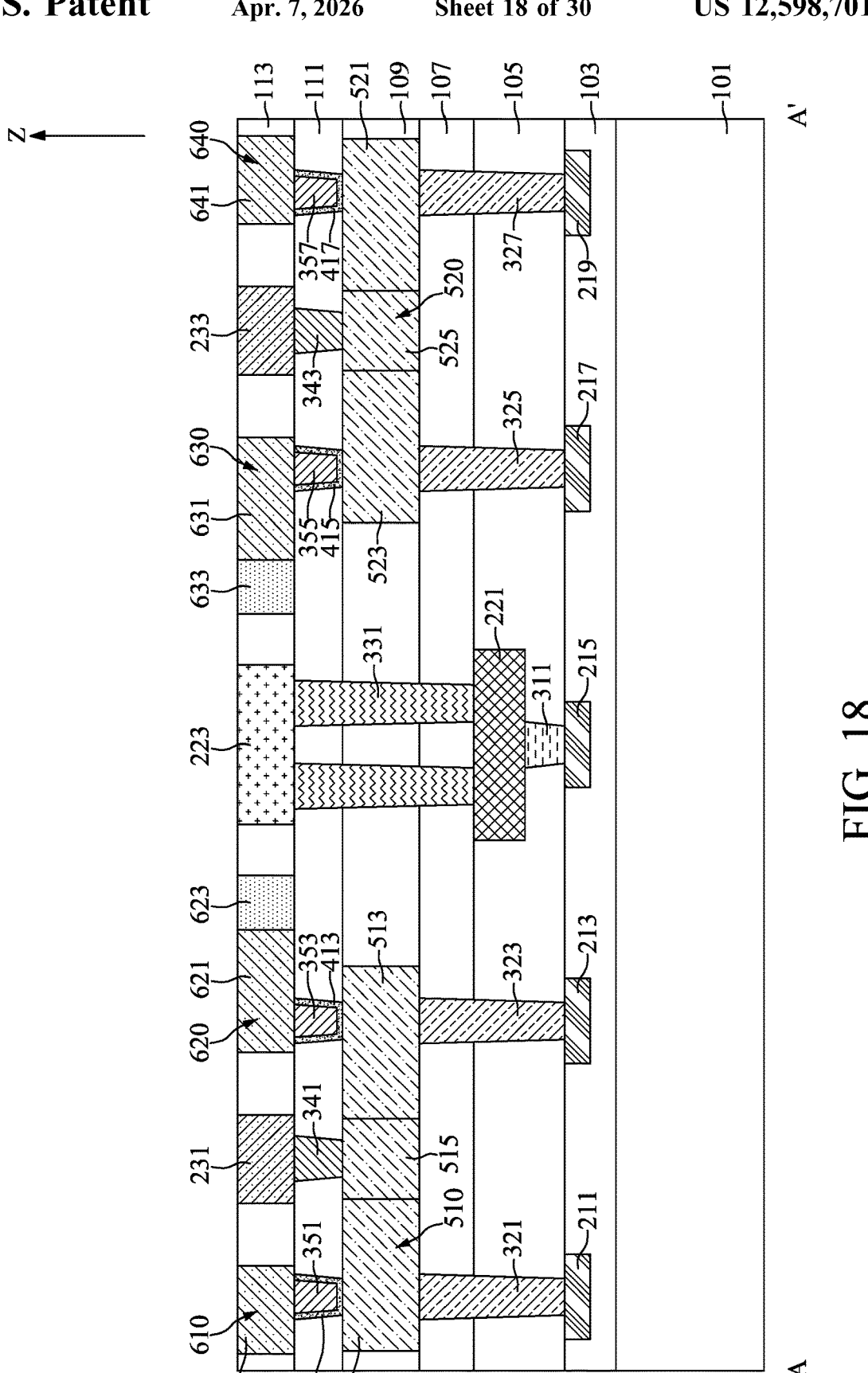
FIGS. 18 and 19 are schematic cross-sectional view diagrams taken along lines A-A' and B-B' in FIG. 17 illustrating part of a flow for fabricating the semiconductor device in accordance with one embodiment of the present disclosure.
Figure 19:
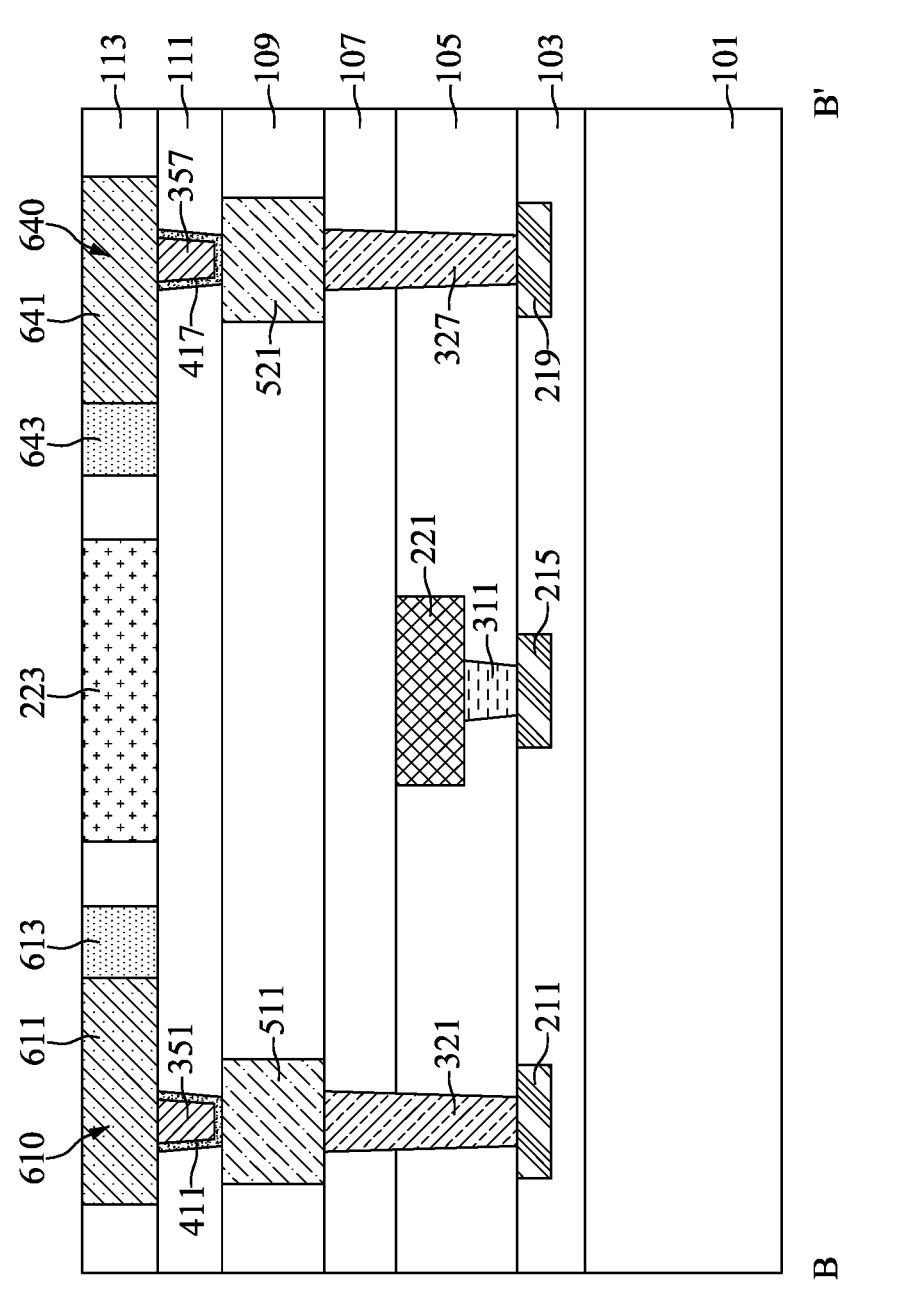

FIG. 14 illustrates, in a schematic top-view diagram, an intermediate semiconductor device in accordance with one embodiment of the present disclosure. FIGS. 15 and 16 are schematic cross-sectional view diagrams taken along lines A-A' and B-B' in FIG. 14. FIG. 17 illustrates, in a schematic top-view diagram, an intermediate semiconductor device in accordance with one embodiment of the present disclosure. FIGS. 18 and 19 are schematic cross-sectional view diagrams taken along lines A-A' and B-B' in FIG. 17 illustrating part of a flow for fabricating the semiconductor device 1A in accordance with one embodiment of the present disclosure.

Figure 20:
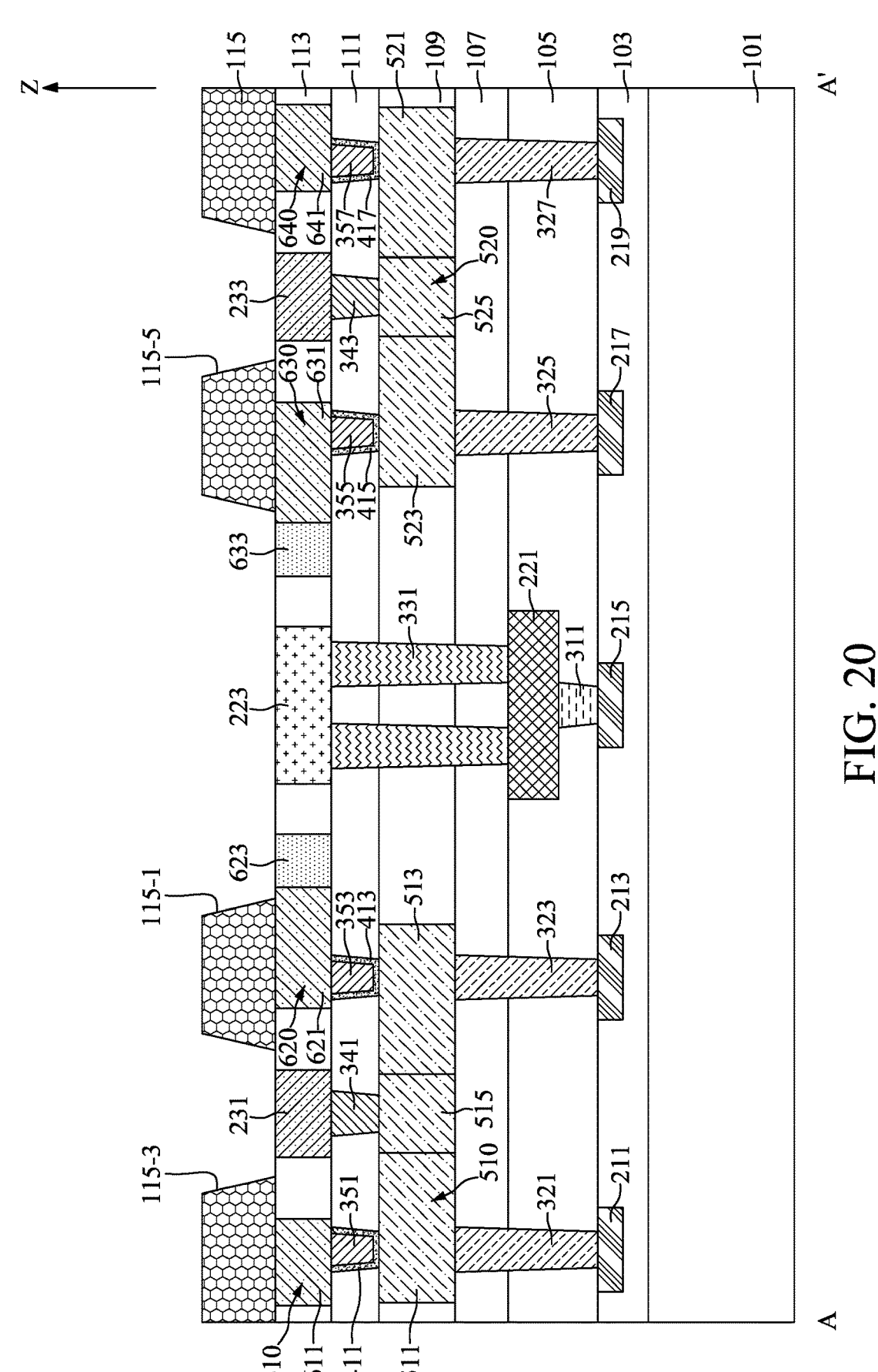
FIGS. 20 and 21 are schematic cross-sectional view diagrams taken along lines A-A' and B-B' in FIG. 17 illustrating part of the flow for fabricating the semiconductor device in accordance with one embodiment of the present disclosure.
Figure 21:
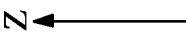
Figure 22:
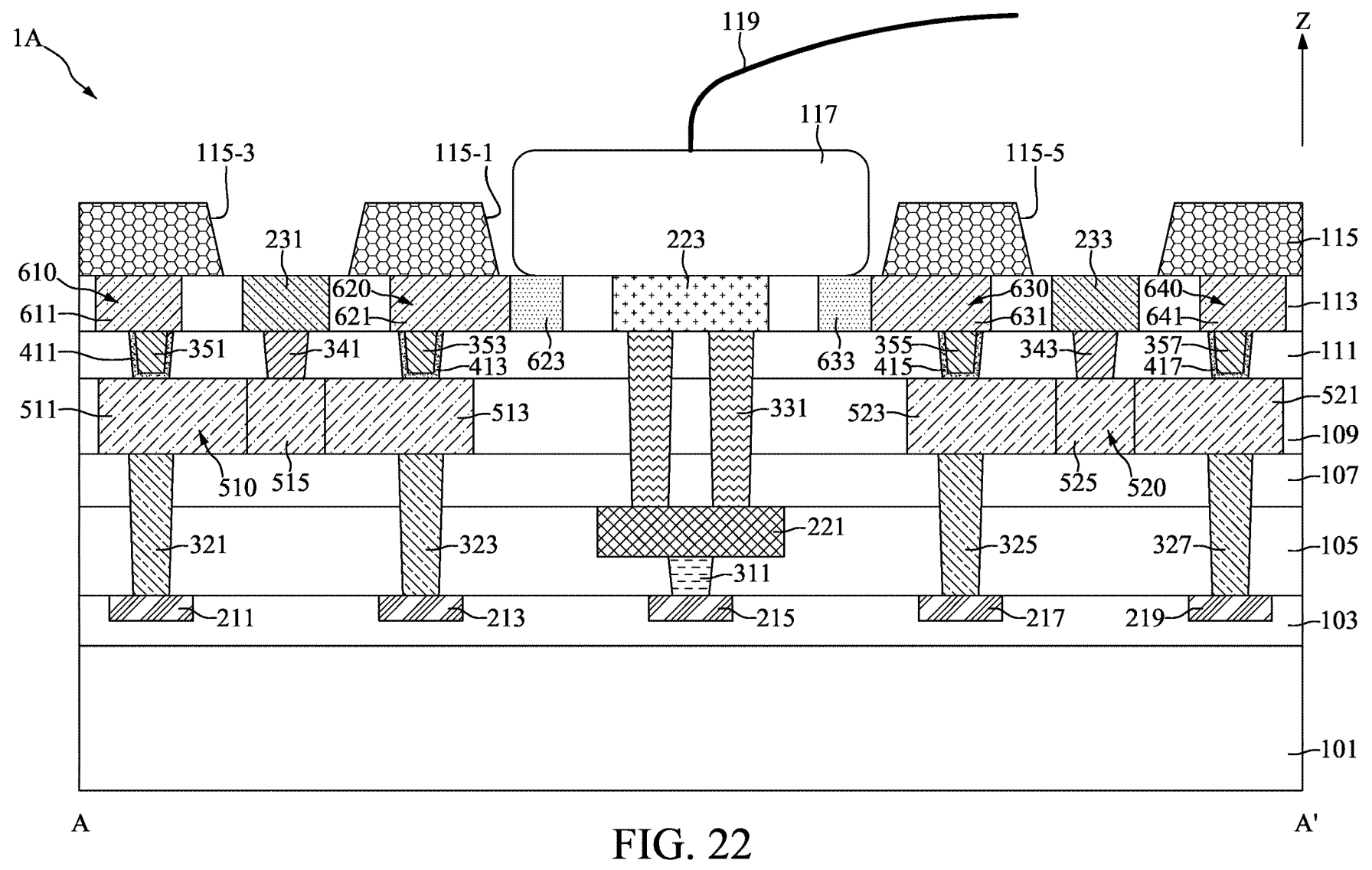
Figure 23:
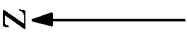

FIGS. 20 and 21 are schematic cross-sectional view diagrams taken along lines A-A' and B-B' in FIG. 17 illustrating part of the flow for fabricating the semiconductor device 1A in accordance with one embodiment of the present disclosure. FIGS. 22 and 23 are schematic cross-sectional view diagrams taken along lines A-A' and B-B' in FIG. 17 illustrating part of the flow for fabricating the semiconductor device 1A in accordance with one embodiment of the present disclosure.

With reference to FIG. 1 and FIGS. 14 to 16, at step S13, a first top via 341 and a plurality of second top vias 351, 353 may be formed on the first bottom selection structure 510, a plurality of main top vias 331 may be formed on the main bridge pad 221, a third top via 343 and a plurality of fourth top vias 355, 357 may be formed on the second bottom selection structure 520, a plurality of first insulating layers 411, 413 may be formed between the plurality of second top vias 351, 353 and the first bottom selection structure 510, and a plurality of second insulating layers 415, 417 may be formed between the plurality of fourth top vias 355, 357 and the second bottom selection structure 520.

With reference to FIGS. 14 to 16, a fifth dielectric layer 111 may be formed on the fourth dielectric layer 109. In some embodiments, the fifth dielectric layer 111 may be referred to as part of the dielectric layers of the substrate 101. In some embodiments, the fifth dielectric layer 111 may be formed of a same material as the first dielectric layer 103 and may be formed of a similar procedure as the first dielectric layer 103, and descriptions thereof are not repeated herein.

With reference to FIGS. 14 to 16, the plurality of main top vias 331 may be formed along the fifth dielectric layer 111, the fourth dielectric layer 109, and the third dielectric layer 107 and formed on the main bridge pad 221. The plurality of main top vias 331 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. During the formation of the plurality of main top vias 331, the first bottom selection structure 510 and the second bottom selection structure 520 may be covered by a mask layer (not shown for clarity) which is removed after the formation of the plurality of main top vias 331.

With reference to FIGS. 14 to 16, a plurality of via openings (not shown for clarity) may be formed along the fifth dielectric layer 111 to expose the first horizontal bottom selection layer 511, the first vertical bottom selection layer 513, the second horizontal bottom selection layer 521, and the second vertical bottom selection layer 523. An insulating layer (not shown for clarity) may be conformally formed in the plurality of via openings and on the top surface of the fifth dielectric layer 111. A conductive layer may be formed on the insulating layer and may completely fill the plurality of via openings. A planarization process, such as chemical mechanical polishing, may be performed until the top surface of the fifth dielectric layer 111 is exposed to remove excess material and provide a substantially flat surface for subsequent processing steps. After the planarization process, the remaining insulating layer may be turned into the plurality of first insulating layers 411, 413 and the plurality of second insulating layers 415, 417. The remaining conductive layer may be turned into the plurality of second top vias 351, 353 and the plurality of fourth top vias 355, 357.

In some embodiments, the insulating layer may be formed of, for example, a high-k material. In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof. In some embodiments, the conductive layer may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

The plurality of main top vias 331 may be covered during the formation of the plurality of second top vias 351, 353, the plurality of fourth top vias 355, 357, the plurality of first insulating layers 411, 413, and the plurality of second insulating layers 415, 417.

Detailedly, the second top via 351 may be formed on the first horizontal bottom selection layer 511. The first insulating layer 411 may be formed between the second top via 351 and the first horizontal bottom selection layer 511. The second top via 353 may be formed on the first vertical bottom selection layer 513. The first insulating layer 413 may be formed between the second top via 353 and the first vertical bottom selection layer 513. The fourth top via 355 may be formed on the second vertical bottom selection layer 523. The second insulating layer 415 may be formed between the fourth top via 355 and the second vertical bottom selection layer 523. The fourth top via 357 may be formed on the second horizontal bottom selection layer 521.

The second insulating layer 417 may be formed between the fourth top via 357 and the second horizontal bottom selection layer 521.

With reference to FIGS. 14 to 16, the first top via 341 and the third top via 343 may be formed along the fifth dielectric layer 111. The first top via 341 may be formed on the first connecting bottom selection layer 515. The third top via 343 may be formed on the second connecting bottom selection layer 525. In some embodiments, the first top via 341 and the third top via 343 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIG. 1 and FIGS. 17 to 19, at step S15, a main signal pad 223 may be formed above the main bridge pad 221, a first ground layer 231 may be formed on the first top via 341, a second ground layer 233 may be formed on the third top via 343, a first top selection structure 610 and a second top selection structure 620 may be formed on the plurality of second top vias 351, 353, and a third top selection structure 630 and a fourth top selection structure 640 may be formed on the plurality of fourth top vias 355, 357.

With reference to FIGS. 17 to 19, a sixth dielectric layer 113 may be formed on the fifth dielectric layer 111. In some embodiments, the sixth dielectric layer 113 may be referred to as part of the dielectric layers of the substrate 101. In some embodiments, the sixth dielectric layer 113 may be formed of a same material as the first dielectric layer 103 and may be formed of a similar procedure as the first dielectric layer 103, and descriptions thereof are not repeated herein.

With reference to FIGS. 17 to 19, the main signal pad 223, the first ground layer 231, the second ground layer 233, the first top selection structure 610, the second top selection structure 620, the third top selection structure 630, and the fourth top selection structure 640 may be formed along the sixth dielectric layer 113. In some embodiments, openings (not shown in FIGS. 17 to 19) may be formed in the sixth dielectric layer 113 and a conductive material may be formed to fill the openings to form the main signal pad 223, the first ground layer 231, the second ground layer 233, the first top selection structure 610, the second top selection structure 620, the third top selection structure 630, and the fourth top selection structure 640. A planarization process, such as chemical mechanical polishing, may be performed after the filling of the conductive material to remove excess material and provide a substantially flat surface for subsequent processing steps.

The openings may be formed by a photolithography process and a subsequent etching process. In some embodiments, the etching process may be an anisotropic dry etching process using argon and tetrafluoromethane as etchants. The process temperature of the etching process may be between about 120° C. and about 160° C. The process pressure of the etching process is between about 0.3 Torr and about 0.4 Torr. The process duration of the etching process may be between about 33 seconds and about 39 seconds.

Alternatively, in some embodiments, the etching process may be an anisotropic dry etching process using helium and nitrogen trifluoride as etchants. The process temperature of the etching process may be between about 80° C. and about 100° C. The process pressure of the etching process is between about 1.2 Torr and about 1.3 Torr. The process duration of the etching process may be between about 20 seconds and about 30 seconds.

In some embodiments, the conductive material may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

In some embodiments, the openings may be sequentially filled with the conductive material by sputtering or electroless plating. For example, when the openings are filled by sputtering using an aluminum-copper material as source, the process temperature of sputtering may be between about 100° C. and about 400° C. The process pressure of sputtering may be between about 1 mTorr and about 100 mTorr. For another example, the openings may be filled by an electroplating process using a plating solution. The plating solution may comprise copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C.

With reference to FIGS. 17 to 19, the main signal pad 223 may be formed on the plurality of main top vias 331 to electrically couple to the main bridge pad 221 and the bottom pad 215. The first ground layer 231 may be formed on the first top via 341 to electrically couple to the first connecting bottom selection layer 515 of the first bottom selection structure 510. The second ground layer 233 may be formed on the third top via 343 to electrically couple to the second connecting bottom selection layer 525 of the second bottom selection structure 520.

With reference to FIGS. 17 to 19, the first top selection structure 610 may be formed on the second top via 351. The second top selection structure 620 may be formed on the second top via 353. The third top selection structure 630 may be formed on the fourth top via 355. The fourth top selection structure 640 may be formed on the fourth top via 357. The main signal pad 223, the first ground layer 231, the second ground layer 233, the first top selection structure 610, the second top selection structure 620, the third top selection structure 630, and the fourth top selection structure 640 may be at a same vertical level VL3 higher than the vertical level VL2 of the first bottom selection structure 510 and the second bottom selection structure 520.

Detailedly, the first top selection structure 610 may include a first connecting top selection layer 611 and the first signal top selection layer 613. In a top-view perspective, the first connecting top selection layer 611 may have a line-shaped profile extending along the direction Y and may be separated from the main signal pad 223 along the direction Y. The first connecting top selection layer 611 may be partially overlapped with the first horizontal bottom selection layer 511. For example, in the present embodiment, the lower portion of the first connecting top selection layer 611 is overlapped with the first horizontal bottom selection layer 511. The first signal top selection layer 613 may contact the upper portion of the first connecting top selection layer 611, be separated from the main signal pad 223, and be between the main signal pad 223 and the first connecting top selection layer 611. In some embodiments, the first signal top selection layer 613 may have an arc-like profile. The concave of the first signal top selection layer 613 may face the main signal pad 223.

The second top selection structure 620 may include a second connecting top selection layer 621 and the second signal top selection layer 623. In a top-view perspective, the second connecting top selection layer 621 may have a line-shaped profile extending along the direction X and may be separated from the main signal pad 223 along the direction X. The second connecting top selection layer 621 may be partially overlapped with the first vertical bottom selection layer 513. For example, in the present embodiment, the left portion of the second connecting top selection layer 621 is overlapped with the first vertical bottom selection layer 513. The second signal top selection layer 623 may contact the right portion of the second connecting top selection layer 621, be separated from the main signal pad 223, and be between the main signal pad 223 and the second connecting top selection layer 621. In some embodiments, the second signal top selection layer 623 may have an arc-like profile. The concave of the second signal top selection layer 623 may face the main signal pad 223.

The third top selection structure 630 may include a third connecting top selection layer 631 and the third signal top selection layer 633. In a top-view perspective, the third connecting top selection layer 631 may have a line-shaped profile extending along the direction X, be separated from the second signal top selection layer 623 along the direction X with the main signal pad 223 interposed therebetween. The third connecting top selection layer 631 may be partially overlapped with the second vertical bottom selection layer 523. For example, in the present embodiment, the right portion of the third connecting top selection layer 631 is overlapped with the second vertical bottom selection layer 523. The third signal top selection layer 633 may contact the left portion of the third connecting top selection layer 631, be separated from the main signal pad 223, and be between the main signal pad 223 and the third connecting top selection layer 631. State differently, the third signal top selection layer 633 may be separated from the second signal top selection layer 623 along the direction X with the main signal pad 223 interposed therebetween. In some embodiments, the third signal top selection layer 633 may have an arc-like profile. The concave of the third signal top selection layer 633 may face the main signal pad 223.

The fourth top selection structure 640 may include a fourth connecting top selection layer 641 and the fourth signal top selection layer 643. In a top-view perspective, the fourth connecting top selection layer 641 may have a line-shaped profile extending along the direction Y, be separated from the first signal top selection layer 613 along the direction Y with the main signal pad 223 interposed therebetween. The fourth connecting top selection layer 641 may be partially overlapped with the second horizontal bottom selection layer 521. For example, in the present embodiment, the upper portion of the fourth connecting top selection layer 641 is overlapped with the second horizontal bottom selection layer 521. The fourth signal top selection layer 643 may contact the lower portion of the fourth connecting top selection layer 641, be separated from the main signal pad 223, and be between the main signal pad 223 and the fourth connecting top selection layer 641. State differently, the fourth signal top selection layer 643 may be separated from the first signal top selection layer 613 along the direction Y with the main signal pad 223 interposed therebetween. In some embodiments, the fourth signal top selection layer 643 may have an arc-like profile. The concave of the fourth signal top selection layer 643 may face the main signal pad 223.

With reference to FIG. 1 and FIGS. 20 to 23, at step S17, a wiring pad 117 may be formed on the main signal pad 223, the first top selection structure 610, the second top selection structure 620, the third top selection structure 630, and the fourth top selection structure 640.

With reference to FIGS. 20 and 21, a top passivation layer 115 may be formed on the sixth dielectric layer 113. In some other embodiments, the top passivation layer 115 may be a dielectric layer. The dielectric layer may comprise a nitride such as silicon nitride, an oxide such as silicon oxide, an oxynitride such as silicon oxynitride, silicon nitride oxide, phosphosilicate glass, borosilicate glass, boron-doped phosphosilicate glass, or the like, or a combination thereof. In some embodiments, the top passivation layer 115 may comprise polybenzoxazole, polyimide, benzocyclobutene, ajinomoto build-up film, solder resist film, the like, or a combination thereof. The top passivation layer 115 formed of polymeric material may have a number of attractive characteristics such as the ability to fill openings of high aspect ratio, a relatively low dielectric constant (about 3.2), a simple depositing process, the reduction of sharp features or steps in the underlying layer, and high temperature tolerance after curing.

In some embodiments, the top passivation layer 115 may be formed by, for example, spin-coating, lamination, deposition, or the like. The deposition may comprise chemical vapor deposition such as plasma-enhanced chemical vapor deposition. The process temperature of the plasma-enhanced chemical vapor deposition may be between about 350° C. and about 450° C. The process pressure of the plasma-enhanced chemical vapor deposition may be between about 2.0 Torr and about 2.8 Torr. The process duration of the plasma-enhanced chemical vapor deposition may be between about 8 seconds and about 12 seconds.

With reference to FIGS. 20 and 21, a plurality of openings 115-1, 115-3, 115-5 may be formed along the top passivation layer 115 to expose the first ground layer 231, the second ground layer 233, the main signal pad 223, the first signal top selection layer 613, the second signal top selection layer 623, the third signal top selection layer 633, and the fourth signal top selection layer 643. Detailedly, the main signal pad 223, the first signal top selection layer 613, the second signal top selection layer 623, the third signal top selection layer 633, and the fourth signal top selection layer 643 may be exposed through the opening 115-1. The first ground layer 231 may be exposed through the opening 115-3. The second ground layer 233 may be exposed through the opening 115-5.

With reference to FIGS. 20 and 21, the first top selection structure 610, the second top via 351, the first insulating layer 411, and the first bottom selection structure 510 may configure a programmable unit (also referred to as the first programmable unit) such as an anti-fuse. The second top selection structure 620, the second top via 353, the first insulating layer 413, and the first bottom selection structure 510 may configure a programmable unit (also referred to as the second programmable unit) such as an anti-fuse. The third top selection structure 630, the second top via 355, the second insulating layer 415, and the second bottom selection structure 520 may configure a programmable unit (also referred to as the third programmable unit) such as an anti-fuse. The fourth top selection structure 640, the second top via 357, the second insulating layer 417, and the second bottom selection structure 520 may configure a programmable unit (also referred to as the fourth programmable unit) such as an anti-fuse.

The programmable units may be respectively programmed to form one or multiple signal paths. For example, during the programming of the first programmable unit, a high voltage (e.g., +6.0 volts) may be applied to the first signal top selection layer 613 and the first ground layer 231 may be grounded. The first insulating layer 411 sandwiched by the second top via 351 and the first horizontal bottom selection layer 511 may be stressed under the programming voltage. As a result, the sandwiched portion of the first insulating layer 411 (e.g., the bottom of the first insulating layer 411) will be ruptured to form a contiguous path connecting the first top selection structure 610 and the first horizontal bottom selection layer 511. In other words, the sandwiched portion of the first insulating layer 411 may be blown out and the first programmable unit is programmed. Due to no voltage is applied to the second signal top selection layer 623, third signal top selection layer 633, the fourth signal top selection layer 643, and the second ground layer 233, the first insulating layers 413, the second insulating layer 415, and the second insulating layer 417 are still intact after programming.

For another example, during the programming of the first programmable unit and the second programmable unit, a high voltage (e.g., +6.0 volts) may be applied to the first signal top selection layer 613 and the second signal top selection layer 623. The first ground layer 231 may be grounded. The first insulating layer 411 sandwiched by the second top via 351 and the first horizontal bottom selection layer 511 and the first insulating layer 413 sandwiched by the second top via 353 and the first vertical bottom selection layer 513 may be stressed under the programming voltage. As a result, the sandwiched portion of the first insulating layer 411 (e.g., the bottom of the first insulating layer 411) and the sandwiched portion of the first insulating layer 413 (e.g., the bottom of the first insulating layer 413) will be ruptured to form two contiguous paths connecting the first top selection structure 610 and the first horizontal bottom selection layer 511 and connecting the second top selection structure 620 and the first vertical bottom selection layer 513. In other words, the sandwiched portion of the first insulating layer 411 and the sandwiched portion of the first insulating layer 413 may be blown out. The first programmable unit and the second programmable unit are programmed. Due to no voltage is applied to the third signal top selection layer 633, the fourth signal top selection layer 643, and the second ground layer 233, the second insulating layer 415 and the second insulating layer 417 are still intact after programming.

For another example, during the programming of the first programmable unit and the third programmable unit, a high voltage (e.g., +6.0 volts) may be applied to the first signal top selection layer 613 and the third signal top selection layer 633. The first ground layer 231 and the second ground layer 233 may be grounded. The first insulating layer 411 sandwiched by the second top via 351 and the first horizontal bottom selection layer 511 and the second insulating layer 415 sandwiched by the second top via 355 and the second vertical bottom selection layer 523 may be stressed under the programming voltage. As a result, the sandwiched portion of the first insulating layer 411 (e.g., the bottom of the first insulating layer 411) and the sandwiched portion of the second insulating layer 415 (e.g., the bottom of the second insulating layer 415) will be ruptured to form two contiguous paths connecting the first top selection structure 610 and the first horizontal bottom selection layer 511 and connecting the third top selection structure 630 and the second vertical bottom selection layer 523. In other words, the sandwiched portion of the first insulating layer 411 and the sandwiched portion of the second insulating layer 415 may be blown out. The first programmable unit and the third programmable unit are programmed. Due to no voltage is applied to the second signal top selection layer 623 and the fourth signal top selection layer 643, the first insulating layer 413 and the second insulating layer 417 are still intact after programming.

With reference to FIGS. 22 and 23, the wiring pad 117 may be formed on the main signal pad 223, on the first signal top selection layer 613, on the second signal top selection layer 623, on the third signal top selection layer 633, and on the fourth signal top selection layer 643. A wire 119 may be formed on the wiring pad 117 to electrically couple the wiring pad 117 to an external element (e.g., other dies). The wiring pad 117 may include tin, lead, silver, copper, nickel, bismuth or an alloy thereof.

Figure 24:
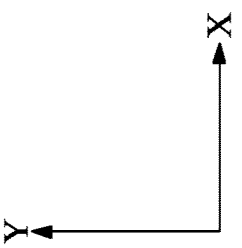
FIG. 24 illustrates, in a schematic top-view diagram, a semiconductor device in accordance with another embodiment of the present disclosure.

FIG. 24 illustrates, in a schematic top-view diagram, a semiconductor device 1B in accordance with another embodiment of the present disclosure.

With reference to FIG. 24, the semiconductor device 1B may have a structure similar to that illustrated in FIG. 17. The same or similar elements in FIG. 24 as in FIG. 17 have been marked with similar reference numbers and duplicative descriptions have been omitted. In the semiconductor device 1B, the first signal top selection layer 613, the second signal top selection layer 623, the third signal top selection layer 633, and the fourth signal top selection layer 643 may have a line-shaped profile in a top-view perspective. For example, the first signal top selection layer 613 and the fourth signal top selection layer 643 may have a line-shaped profile extending along the direction X. The second signal top selection layer 623 and the second signal top selection layer 623 may have a line-shaped profile extending along the direction Y.

Figure 25:
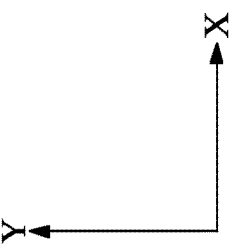
FIG. 25 illustrates, in a schematic top-view diagram, an intermediate semiconductor device in accordance with another embodiment of the present disclosure.
Figure 26:
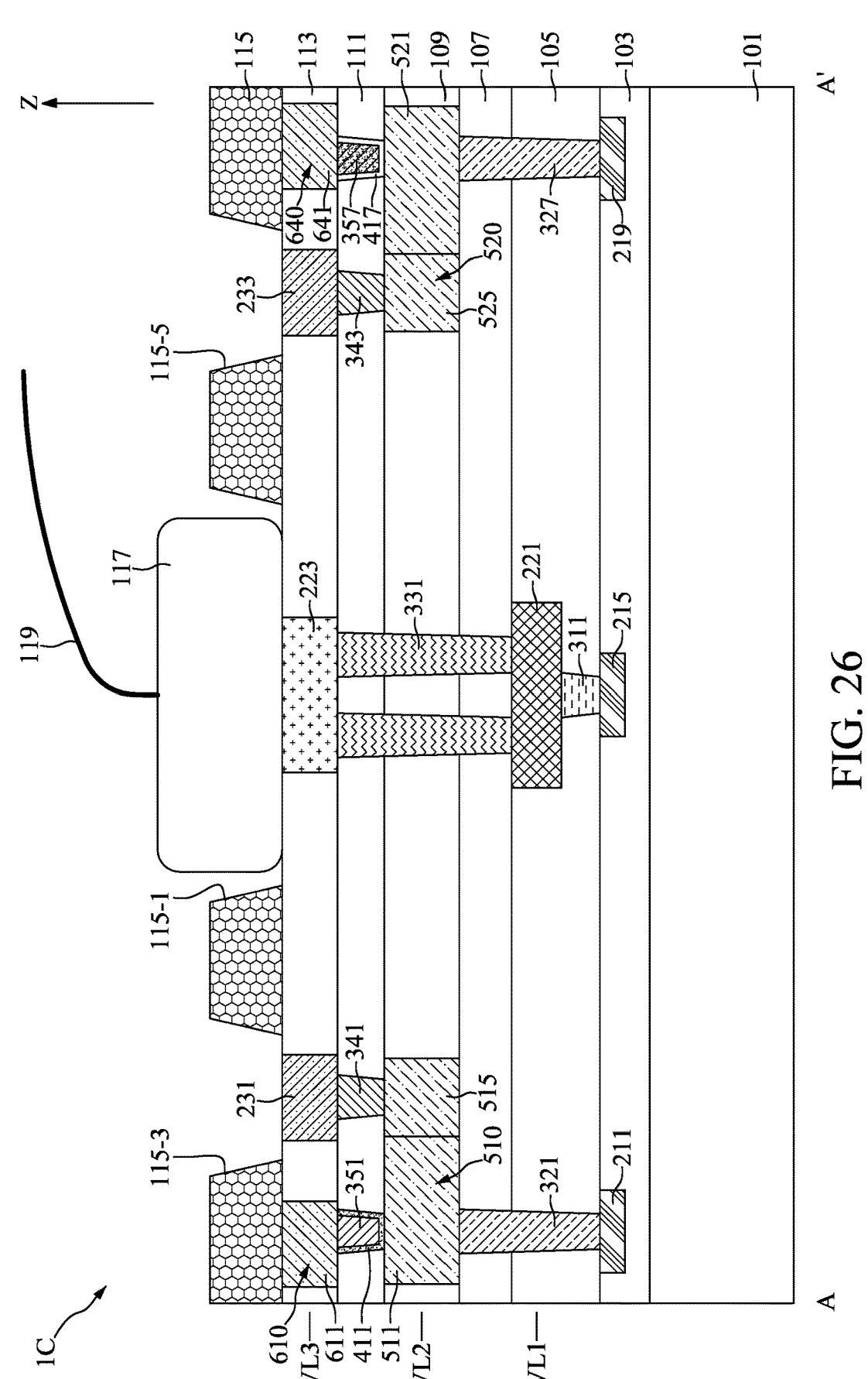
FIGS. 26 and 27 are schematic cross-sectional view diagrams taken along lines A-A' and B-B' in FIG. 25.
Figure 27:

FIG. 25 illustrates, in a schematic top-view diagram, an intermediate semiconductor device in accordance with another embodiment of the present disclosure. FIGS. 26 and 27 are schematic cross-sectional view diagrams taken along lines A-A' and B-B' in FIG. 25.

With reference to FIGS. 25 to 27, the semiconductor device 1C may have a structure similar to that illustrated in FIGS. 17, 22, and 23. The same or similar elements in FIGS. 25 to 27 as in FIGS. 17, 22, and 23 have been marked with similar reference numbers and duplicative descriptions have been omitted. The semiconductor device 1C only includes the first programmable unit and the fourth programmable unit.

Figure 28:
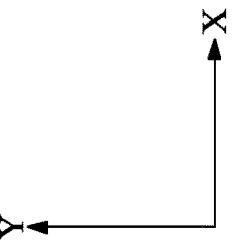
FIG. 28 illustrates, in a schematic top-view diagram, an intermediate semiconductor device in accordance with another embodiment of the present disclosure.
Figure 29:
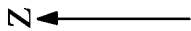
FIGS. 29 and 30 are schematic cross-sectional view diagrams taken along lines A-A' and B-B' in FIG. 28.
Figure 30:
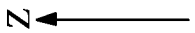

FIG. 28 illustrates, in a schematic top-view diagram, an intermediate semiconductor device in accordance with another embodiment of the present disclosure. FIGS. 29 and 30 are schematic cross-sectional view diagrams taken along lines A-A' and B-B' in FIG. 28.

With reference to FIGS. 28 to 30, the semiconductor device 1D may have a structure similar to that illustrated in FIGS. 17, 22, and 23. The same or similar elements in FIGS. 28 to 30 as in FIGS. 17, 22, and 23 have been marked with similar reference numbers and duplicative descriptions have been omitted. The semiconductor device 1D only includes the first programmable unit and the second programmable unit.

One aspect of the present disclosure provides a semiconductor device including a first top selection structure positioned at a same vertical level as a main signal pad, along a first direction, and separated from the main signal pad; a second top selection structure positioned at the same vertical level as the main signal pad, along a second direction different from the first direction, and separated from the main signal pad; a first ground layer positioned at the same vertical level as the main signal pad and separated from the main signal pad, the first top selection structure, and the second top selection structure; a first bottom selection structure positioned at a vertical level lower than the main signal pad and partially overlapped with the first top selection structure, the second top selection structure, and the first ground layer in a top-view perspective; a first top via positioned between the first ground layer and the first bottom selection structure; a plurality of second top vias positioned between the first top selection structure and the first bottom selection structure, and between the second top selection structure and the first bottom selection structure; a plurality of first insulating layers positioned between the plurality of second top vias and the first bottom selection structure; and a wiring pad positioned on the main signal pad, the first top selection structure, and the second top selection structure.

Another aspect of the present disclosure provides a semiconductor device including a first top selection structure positioned at a same vertical level as a main signal pad, along a first direction, and separated from the main signal pad; a fourth top selection structure positioned at the same vertical level as the main signal pad and separated from the first top selection structure along the first direction with the main signal pad interposed therebetween; a first ground layer positioned at the same vertical level as the main signal pad and separated from the main signal pad and the first top selection structure; a second ground layer positioned at the same vertical level as the main signal pad and separated from the fourth top selection structure and the main signal pad; a first bottom selection structure positioned at a vertical level lower than the main signal pad and partially overlapped with the first top selection structure and the first ground layer in a top-view perspective; a second bottom selection structure positioned at the same vertical level as the first bottom selection structure and partially overlapped with the fourth top selection structure and the second ground layer in a top-view perspective; a first top via positioned between the first ground layer and the first bottom selection structure; a third top via positioned between the second ground layer and the second bottom selection structure; a second top via positioned between the first top selection structure and the first bottom selection structure; a fourth top via positioned between the fourth top selection structure and the second bottom selection structure; and a first insulating layer positioned between the second top via and the first bottom selection structure; a second insulating layer positioned between the fourth top via and the second bottom selection structure.

Another aspect of the present disclosure provides a method for fabricating a semiconductor device including forming a first bottom selection structure over a substrate and including a first connecting bottom selection layer, a first vertical bottom selection layer extending from the first connecting bottom selection layer along a first direction, and a first horizontal bottom selection layer extending from the first connecting bottom selection layer along a second direction different from the first direction; forming a plurality of second top vias on the first horizontal bottom selection layer and the first vertical bottom selection layer and forming a first top via on the first connecting bottom selection layer; forming a plurality of first insulating layers between the plurality of second top vias and the first horizontal bottom selection layer and between the plurality of second top vias and the first vertical bottom selection layer; forming a first ground layer on the first top via; forming a first top selection structure and a second top selection structure on the plurality of second top vias, respectively and correspondingly; forming a main signal pad at a same vertical level as the first ground layer and separated from the first top selection structure and the second top selection structure; and forming a wiring pad on the main signal pad, the first top selection structure, and the second top selection structure. The first top selection structure is partially overlapped with the first horizontal bottom selection layer and the second top selection structure is partially overlapped with the first vertical bottom selection layer in a top-view perspective.

Due to the design of the semiconductor device of the present disclosure, one or multiple signal paths may be formed depending on the selection during the programming procedure which can be determined by the user's demand. Multiple signals may be conducted solely using the wiring pad 117 to transmit to the main signal pad 223 and the signal path(s) formed through selectively programming of the first top selection structure 610, the second top selection structure 620, the third top selection structure 630, and/or the fourth top selection structure 640 so as to save precious semiconductor real estate. Therefore, more functional elements may be provided for the semiconductor device 1A. As a result, the performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a first top selection structure positioned at a same vertical level as a main signal pad, along a first direction, and separated from the main signal pad; a fourth top selection structure positioned at the same vertical level as the main signal pad and separated from the first top selection structure along the first direction with the main signal pad interposed therebetween;
a first ground layer positioned at the same vertical level as the main signal pad and separated from the main signal pad and the first top selection structure; a second ground layer positioned at the same vertical level as the main signal pad and separated from the fourth top selection structure and the main signal pad;
a first bottom selection structure positioned at a vertical level lower than the main signal pad and partially overlapped with the first top selection structure and the first ground layer in a top-view perspective; a second bottom selection structure positioned at the same vertical level as the first bottom selection structure and partially overlapped with the fourth top selection structure and the second ground layer in a top-view perspective;

a first top via positioned between the first ground layer and the first bottom selection structure; a third top via positioned between the second ground layer and the second bottom selection structure;

a second top via positioned between the first top selection structure and the first bottom selection structure; a fourth top via positioned between the fourth top selection structure and the second bottom selection structure; and a first insulating layer positioned between the second top via and the first bottom selection structure; a second insulating layer positioned between the fourth top via and the second bottom selection structure.

2. The semiconductor device of claim 1, wherein the first bottom selection structure comprises:

a first connecting bottom selection layer positioned directly below the first top via; and a first horizontal bottom selection layer extending from the first connecting bottom selection layer along a second direction and partially overlapped with the first top selection structure;

wherein the second direction is different from the first direction.

3. The semiconductor device of claim 2, wherein the first top selection structure comprises:

a first connecting top selection layer positioned along the first direction and partially overlapped with the first horizontal bottom selection layer in a top-view perspective; and a first signal top selection layer contacting the first connecting top selection layer, separated from the main signal pad, and positioned between the first connecting top selection layer and the main signal pad.

4. The semiconductor device of claim 3, wherein the second bottom selection structure comprises:

a second connecting bottom selection layer positioned directly below the third top via; and a second horizontal bottom selection layer extending from the second connecting bottom selection layer along the second direction and partially overlapped with the fourth top selection structure.

5. The semiconductor device of claim 4, wherein the fourth top selection structure comprises:

a fourth connecting top selection layer separated from the first connecting top selection layer along the first direction with the main signal pad interposed therebetween and partially overlapped with the second horizontal bottom selection layer; and a fourth signal top selection layer contacting the fourth connecting top selection layer, separated from the main signal pad, and positioned between the fourth connecting top selection layer and the main signal pad.

6. The semiconductor device of claim 5, wherein the first signal top selection layer and the fourth signal top selection layer comprise an arc-like profile in a top-view perspective.

7. The semiconductor device of claim 6, further comprising a wiring pad positioned on the main signal pad, the first signal top selection layer, and the fourth signal top selection layer.

8. The semiconductor device of claim 7, wherein the first direction and the second direction are perpendicular to each other.

9. The semiconductor device of claim 8, wherein the first insulating layer and the second insulating layer comprise a high-k material.

10. A method for fabricating a semiconductor device, comprising:

forming a first bottom selection structure over a substrate and comprising a first connecting bottom selection layer, a first vertical bottom selection layer extending from the first connecting bottom selection layer along a first direction, and a first horizontal bottom selection layer extending from the first connecting bottom selection layer along a second direction different from the first direction;

forming a plurality of second top vias on the first horizontal bottom selection layer and the first vertical bottom selection layer and forming a first top via on the first connecting bottom selection layer;

forming a plurality of first insulating layers between the plurality of second top vias and the first horizontal bottom selection layer and between the plurality of second top vias and the first vertical bottom selection layer;

forming a first ground layer on the first top via;

forming a first top selection structure and a second top selection structure on the plurality of second top vias, respectively and correspondingly;

forming a main signal pad at a same vertical level as the first ground layer and separated from the first top selection structure and the second top selection structure; and forming a wiring pad on the main signal pad, the first top selection structure, and the second top selection structure;

wherein the first top selection structure is partially overlapped with the first horizontal bottom selection layer and the second top selection structure is partially overlapped with the first vertical bottom selection layer in a top-view perspective.

11. The method for fabricating the semiconductor device of claim 10, wherein the first top selection structure comprises:

a first connecting top selection layer extending along the first direction and partially overlapped with the first horizontal bottom selection layer in a top-view perspective; and a first signal top selection layer contacting the first connecting top selection layer, separated from the main signal pad, and between the first connecting top selection layer and the main signal pad.

12. The method for fabricating the semiconductor device of claim 11, wherein the second top selection structure comprises:

a second connecting top selection layer extending along the second direction and partially overlapped with the first vertical bottom selection layer in a top-view perspective; and a second signal top selection layer contacting the second connecting top selection layer, separated from the main signal pad, and between the second connecting top selection layer and the main signal pad.

13. The method for fabricating the semiconductor device of claim 12, wherein the first signal top selection layer and the second signal top selection layer comprise an arc-like profile in a top-view perspective.

14. The method for fabricating the semiconductor device of claim 13, wherein the plurality of first insulating layers comprises a high-k material.

\* \* \* \* \*